(12) United States Patent
Luo et al.

(10) Patent No.: US 7,934,137 B2
(45) Date of Patent: Apr. 26, 2011

(54) MESSAGE REMAPPING AND ENCODING

(75) Inventors: Tao Luo, San Diego, CA (US); Etienne F. Chaponniere, San Diego, CA (US); Julien Freudiger, Lausanne (CH)

(73) Assignee: QUALCOMM Incorporated, San Diego, CA (US)

( * ) Notice: Subject to any disclaimer, the term of this patent is extended or adjusted under 35 U.S.C. 154(b) by 953 days.

(21) Appl. No.: 11/670,327

(22) Filed: Feb. 1, 2007

(65) Prior Publication Data

US 2007/0208986 A1    Sep. 6, 2007

Related U.S. Application Data

(60) Provisional application No. 60/771,181, filed on Feb. 6, 2006.

(51) Int. Cl.
*H03M 13/00* (2006.01)
(52) U.S. Cl. ........................................................ 714/751
(58) Field of Classification Search .......... 714/751–752, 714/755, 763, 777; 370/335
See application file for complete search history.

(56) References Cited

U.S. PATENT DOCUMENTS

| 6,148,428 | A | 11/2000 | Welch et al. |
| 6,781,970 | B1 | 8/2004 | Ovesjo et al. |
| 6,996,766 | B2 * | 2/2006 | Cypher .......................... 714/764 |

FOREIGN PATENT DOCUMENTS

| DE | 69907372 | 10/2003 |
| EP | 0991218 A2 | 4/2000 |
| KR | 1020040042039 | 5/2004 |
| RU | 94004747 | 7/1996 |
| RU | 2080738 | 5/1997 |
| RU | 2214048 | 10/2003 |
| WO | WO 01/17283 A2 | 3/2001 |

OTHER PUBLICATIONS

International Search Report ISA-EPO. International Application No. PCT/US2007/061625, Aug. 13, 2007.
Samsung: "Harmonization impact on TFCI and New Optimal Coding for extended TFCI with almost no Complexity increase" Internet Article, [Online] 1999, (XP002445358) Retrieved from the Internet: URL: http://www.3gpp.org/ftp/tsg_ran/WG1_RL1/TSGR1_06/Docs/Pdfs/r1-99913.pdf.

(Continued)

*Primary Examiner* — Shelly A Chase
(74) *Attorney, Agent, or Firm* — Darren M. Simon

(57) ABSTRACT

Techniques for remapping messages prior to encoding to improve performance are described. L designated messages among K total messages are remapped to L remapped messages, which are associated with L codewords having larger relative distance between these codewords, where L may be much less than K. The L designated messages may be more frequently used messages and/or more important messages. The remapping allows the L codewords with larger relative distance to be sent for the L designated messages, which may improve performance. A transmitter remaps an input message to a remapped message, encodes the remapped message to obtain a codeword, and sends the codeword to convey the input message. A receiver decodes a received codeword to obtain a decoded message and demaps the decoded message to obtain a demapped message, which is an estimate of the input message sent by the transmitter.

32 Claims, 5 Drawing Sheets

OTHER PUBLICATIONS

Jon C. Freeman: "Introduction to Forward-Error-Correcting Coding" Internet Article, [Online] Dec. 1996, pp. 33-47, XP002445338 Retrieved from the Internet: URL: http://ntrs.nasa.gov/archive/nasa/casi.ntrs.nasa.gov/19970009858_1997012910.pdf.

International Search Report—PCT/US07/061625—International Search Authority, US—Jul. 17, 2008.
Written Opinion—PCT/US07/061625—International Search Authority. US—Jul. 17, 2008.

* cited by examiner

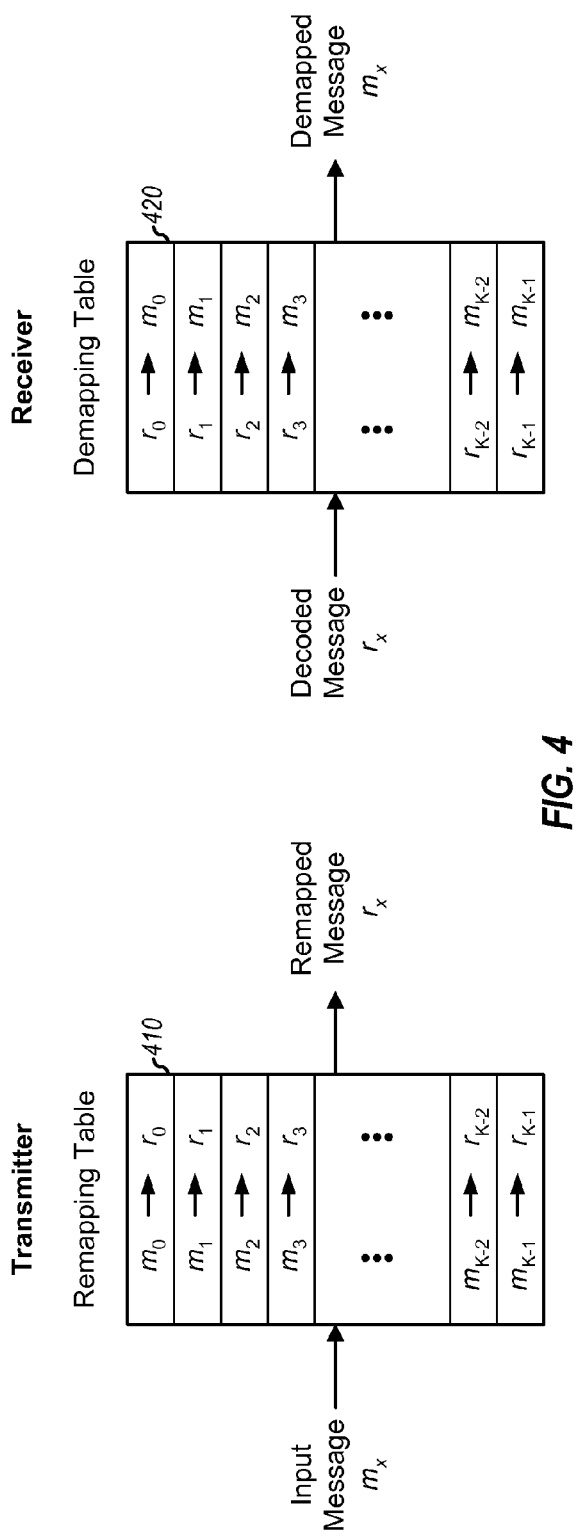
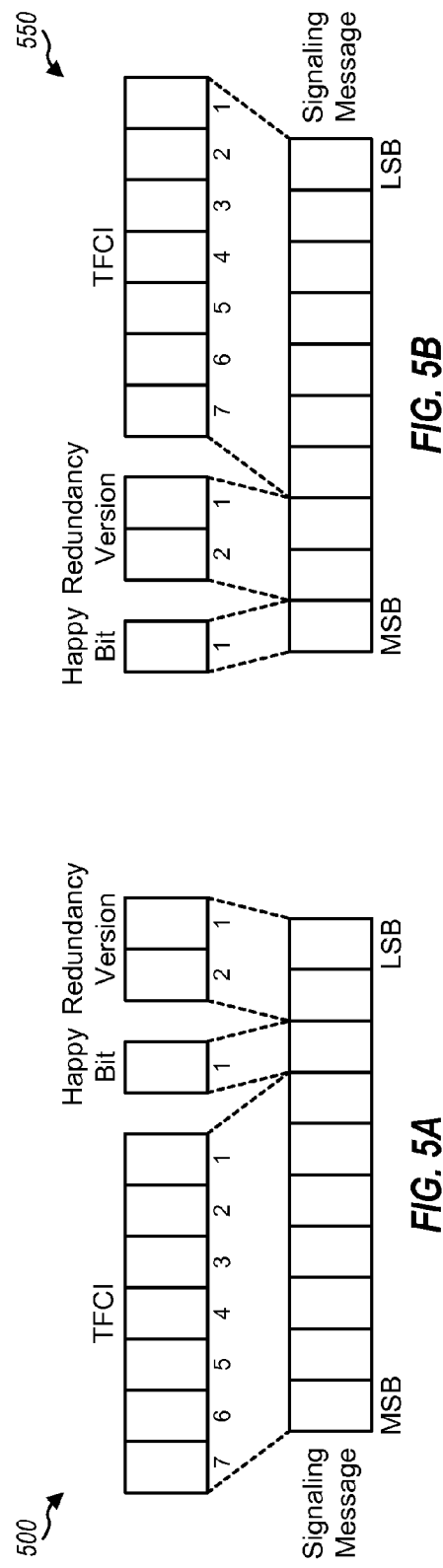
FIG. 4
FIG. 5A
FIG. 5B

MESSAGE REMAPPING AND ENCODING

CLAIM OF PRIORITY UNDER 35 U.S.C. §119

The present Application for Patent claims priority to Provisional Application Ser. No. 60/771,181, entitled "REMAPPING TECHNIQUE TO REDUCE TRANSMITTED POWER IN MOBILE COMMUNICATION SYSTEMS," filed Feb. 6, 2006, assigned to the assignee hereof, and expressly incorporated herein by reference.

BACKGROUND

1. Field

The present disclosure relates generally to communication, and more specifically to techniques for sending messages with encoding.

2. Background

In a communication system, a transmitter may generate messages for information to be sent to a receiver. The transmitter may encode the messages to obtain codewords and further process the codewords to generate a modulated signal that is sent via a communication channel. The communication channel typically distorts the transmitted signal with a channel response and further degrades the signal with noise and interference. The receiver may receive the transmitted signal, process the received signal to obtain received codewords, decode the received codewords to obtain decoded messages, and extract the information from the decoded messages.

Encoding is typically performed in accordance with a particular coding scheme, which may include a block code, a convolutional code, a Turbo code, etc. The coding scheme may be selected based on a tradeoff between various factors such as error correction capability, amount of redundancy, decoding complexity, etc. In general, more redundancy results in longer codewords for a given message size but provides more error correction capability so that messages may be reliably sent in more degraded channel conditions. The converse is generally true for less redundancy.

A specific coding scheme may be selected based on pertinent factors. A codebook containing different codewords may be generated based on this coding scheme. Each message that might be sent may then be mapped to one specific codeword in the codebook, so that a one-to-one mapping exists between messages and codewords. This mapping may be determined by the manner in which the codewords are generated, e.g., each codeword may be generated based on an associated message. Furthermore, the mapping may be under an assumption that all messages are equally likely to be sent. Thus, the performance of the coding scheme is typically quantified by the worst codewords in the codebook.

SUMMARY

Techniques for remapping messages prior to encoding to improve performance are described herein. L designated messages among K total messages may be remapped to L remapped messages, which may be associated with L codewords with larger relative distance between these codewords, where L is smaller than K and may be much smaller than K. A message may also be referred to as a data word, a data unit, a data block, a packet, etc. A codeword may also be referred to as a coded block, a coded packet, etc. The L designated messages may be more frequently used messages, more important messages, etc. The remapping allows the L codewords with larger relative distance to be sent for the L designated messages, which may improve performance.

According to an aspect, an apparatus is described which remaps an input message to a remapped message, encodes the remapped message to obtain a codeword, and sends the codeword to convey the input message. The input message may be in a first set of messages, and the remapped message may be in a second set of messages. The second set of messages may be associated with codewords having larger relative distance than the relative distance of the codewords for the first set of messages.

According to another aspect, an apparatus is described which decodes a received codeword to obtain a decoded message in a first set of messages and demaps the decoded message to obtain a demapped message in a second set of messages. The messages in the first set are associated with codewords having larger relative distance than the relative distance of the codewords for the second set of messages.

According to yet another aspect, an apparatus is described which forms an input message with a plurality of fields that are arranged such that at least one most significant bit of the input message is presumed to be equal to zero. The apparatus further encodes the input message based on a code to obtain a codeword. The code generates a plurality of codewords for a plurality of input messages, with codewords of low indices having larger relative distance than the relative distance of codewords of high indices.

Various aspects and features of the disclosure are described in further detail below.

BRIEF DESCRIPTION OF THE DRAWINGS

FIG. 4 shows a remapping table for the transmitter and a demapping table for the receiver.

FIGS. 5A and 5B show two example message formats.

DETAILED DESCRIPTION

The message remapping techniques described herein may be used for various communication systems such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, etc. The techniques may also be used for wireless local area networks (WLANs), broadcast networks, etc. The terms "systems" and "networks" are often used interchangeably. A CDMA system may implement a radio technology such cdma2000, Universal Terrestrial Radio Access (UTRA), Evolved UTRA (E-UTRA), etc. cdma2000 covers IS-2000, IS-95 and IS-856 standards. UTRA and E-UTRA are part of Universal Mobile Telecommunication System (UMTS). UTRA includes Wideband-CDMA (W-CDMA) and Low Chip Rate (LCR). A TDMA system may implement a radio technology such as Global System for Mobile Communications (GSM). An OFDMA system utilizes Orthogonal Frequency Division Multiplexing (OFDM) and sends modulation symbols in the frequency domain on orthogonal subcarriers. An OFDMA system may implement a radio technology such as Long Term Evolution (LTE), Flash-OFDM®, etc. An SC-FDMA system utilizes Single-Carrier Frequency Division Multiplexing (SC-FDM) and sends modulation symbols in the time domain on orthogonal subcarriers. UTRA, E-UTRA, GSM and LTE are described in documents from an organization named "3rd Generation Partnership Project" (3GPP). cdma2000 is described in documents from an organization named "3rd Generation Partnership Project 2" (3GPP2). These various radio technologies and standards are known in the art.

The techniques may be used to send information on the downlink and/or uplink.

The downlink (or forward link) refers to the communication link from base stations to terminals, and the uplink (or reverse link) refers to the communication link from the terminals to the base stations. A base station is generally a fixed station that communicates with the terminals and may also be referred to as a Node B, an enhanced Node B (eNode B), an access point, etc. A terminal may also be referred to as a user equipment (UE), a mobile station, an access terminal, a station, etc. A terminal may be a cellular phone, a personal digital assistant (PDA), a wireless modem, a wireless communication device, a handheld device, a laptop computer, a subscriber unit, a cordless phone, etc.

Figure 1:
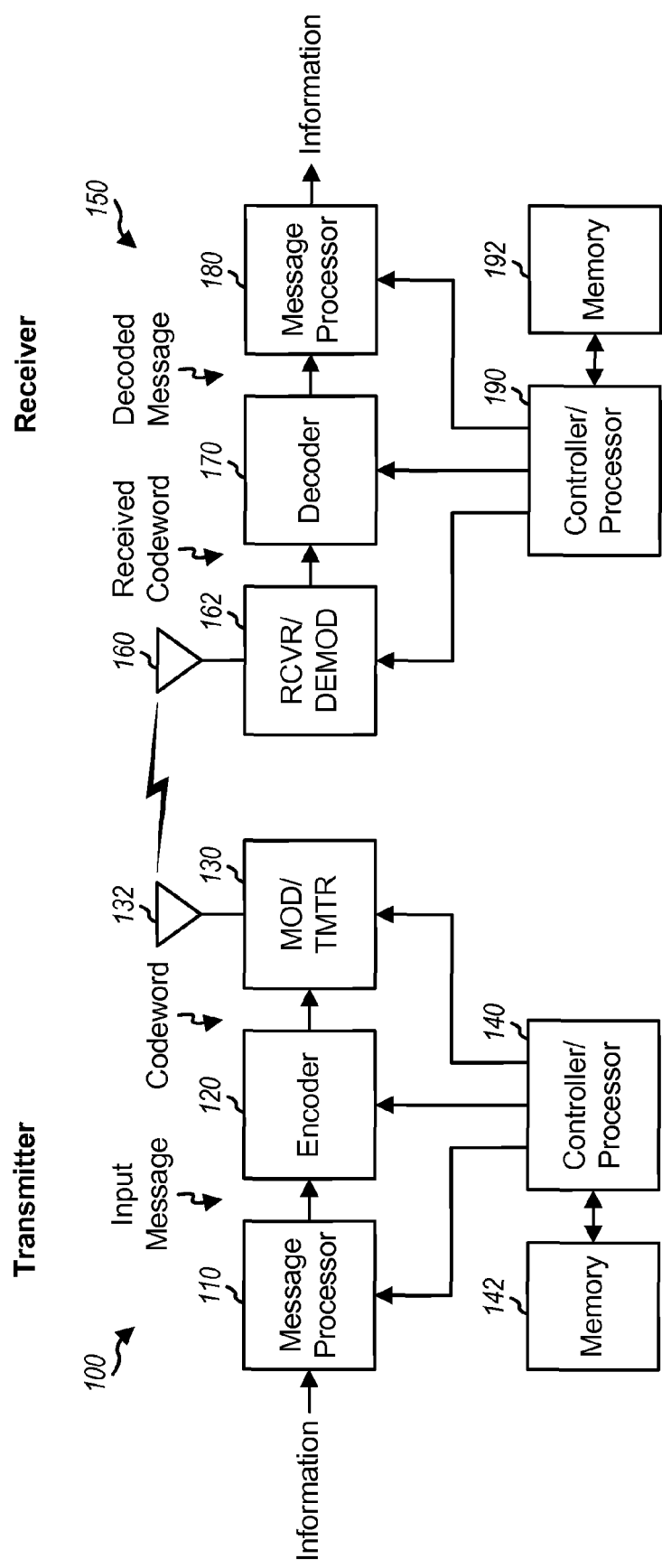
FIG. 1 shows a block diagram of a transmitter and a receiver.

FIG. 1 shows a block diagram of a transmitter 100 and a receiver 150 in a wireless communication system. For the downlink, transmitter 100 may be part of a base station, and receiver 150 may be part of a terminal. For the uplink, transmitter 100 may be part of a terminal, and receiver 150 may be part of a base station.

At transmitter 100, a message processor 110 receives information from a data source (not shown) and/or a controller/processor 140 and generates input messages for the information. The information may be for signaling, traffic data, etc. The input messages may have a fixed or variable size. An encoder 120 receives the input messages from processor 110, encodes these messages based on a coding scheme, and provides a codeword for each input message. The coding scheme may comprise a block code, a convolutional code, a Turbo code, a low density parity check (LDPC) code, an irregular repeat-accumulate (IRA) code, some other code, or a combination thereof. The encoding generates redundancy in the codewords, which increases the reliability of transmission.

A modulator/transmitter (MOD/TMTR) 130 processes the codewords from encoder 120 and generates a modulated signal. The processing by unit 130 may include interleaving, symbol mapping, scrambling, modulation (e.g., for CDMA, OFDM, etc.), digital-to-analog conversion, filtering, amplification, frequency upconversion, etc. The modulated signal is transmitted via an antenna 132.

At receiver 150, an antenna 160 receives the transmitted signal from transmitter 100 and provides a received signal to a receiver/demodulator (RCVR/DEMOD) 162. Unit 162 processes the received signal in a manner complementary to the processing performed by MOD/TMTR 130 and provides received codewords. A decoder 170 decodes each received codeword and provides a corresponding decoded message to a message processor 180. Decoder 170 performs decoding in a manner complementary to the encoding performed by encoder 120 at transmitter 100. For example, decoder 170 may perform block decoding for a block code, Viterbi decoding for a convolutional code, Turbo decoding for a Turbo code, etc. Message processor 180 recovers information from each decoded message and provides the information to a data sink (not shown) and/or a controller/processor 190.

Controllers/processors 140 and 190 control the operation at transmitter 100 and receiver 150, respectively. Memories 142 and 192 store data and program codes for transmitter 100 and receiver 150, respectively.

Encoder 120 may implement a coding scheme that generates a codebook containing K codewords, where K is the codebook size and may be any integer value. K different messages may then be mapped to the K codewords such that each message is associated with a different codeword. The one-to-one mapping between messages and codewords may be dependent on how the codewords are generated.

Each codeword in the codebook has one or more nearest codewords. The distance between each codeword and its nearest codeword(s) may be determined. The K codewords may have different distances to their nearest codewords. The performance of the coding scheme may be quantified by the minimum distance $d_{min}$ among all of the distances for all K codewords in the codebook. This minimum distance determines the error correction capability of the worst codewords in the codebook. These worst codewords have the shortest distant to their nearest codewords and are thus most likely to be decoded in error among all K codewords in the codebook. In general, for a given set of codewords, the worst codewords are those with the shortest distance to the nearest codewords in the set, and the best codewords are those with the longest distance to the nearest codewords in the set. The best and worst codewords are thus typically given with respect to a specific set of codewords.

The system or the coding scheme may assume that the K total messages are equally likely to be sent, which means that the input of the encoder is uniform. Under this assumption, the best and worst codewords in the codebook would be selected with equal probability by the uniformly distributed messages.

However, the K total messages may not be sent with equal probability in many instances. For example, only a small set of L messages among the K total messages may be used or may be used more frequently in certain instances, where L may be much smaller than K. This set of L messages is associated with a set of L codewords, which may be any L codewords in the codebook. Improved performance may be achieved by using L codewords with the largest relative distance between these codewords, instead of any L codewords. Relative distance refers to the distance between specific codewords taken from the codebook, where the term "relative" is due to the fact that only these specific codewords are being considered instead of all codewords in the codebook. The distance between codewords may be given in terms of Hamming distance or some other metric.

In an aspect, a set of L designated messages is remapped to a set of L remapped messages, which is associated with a set of L codewords having larger relative distance. The L designated messages may be more frequently used messages, more important messages, etc. The remapping allows the L codewords with larger relative distance to be sent for the L designated messages, which may improve performance without having to change the coding scheme. The remapping may be performed in various manners, as described below.

Figure 2:
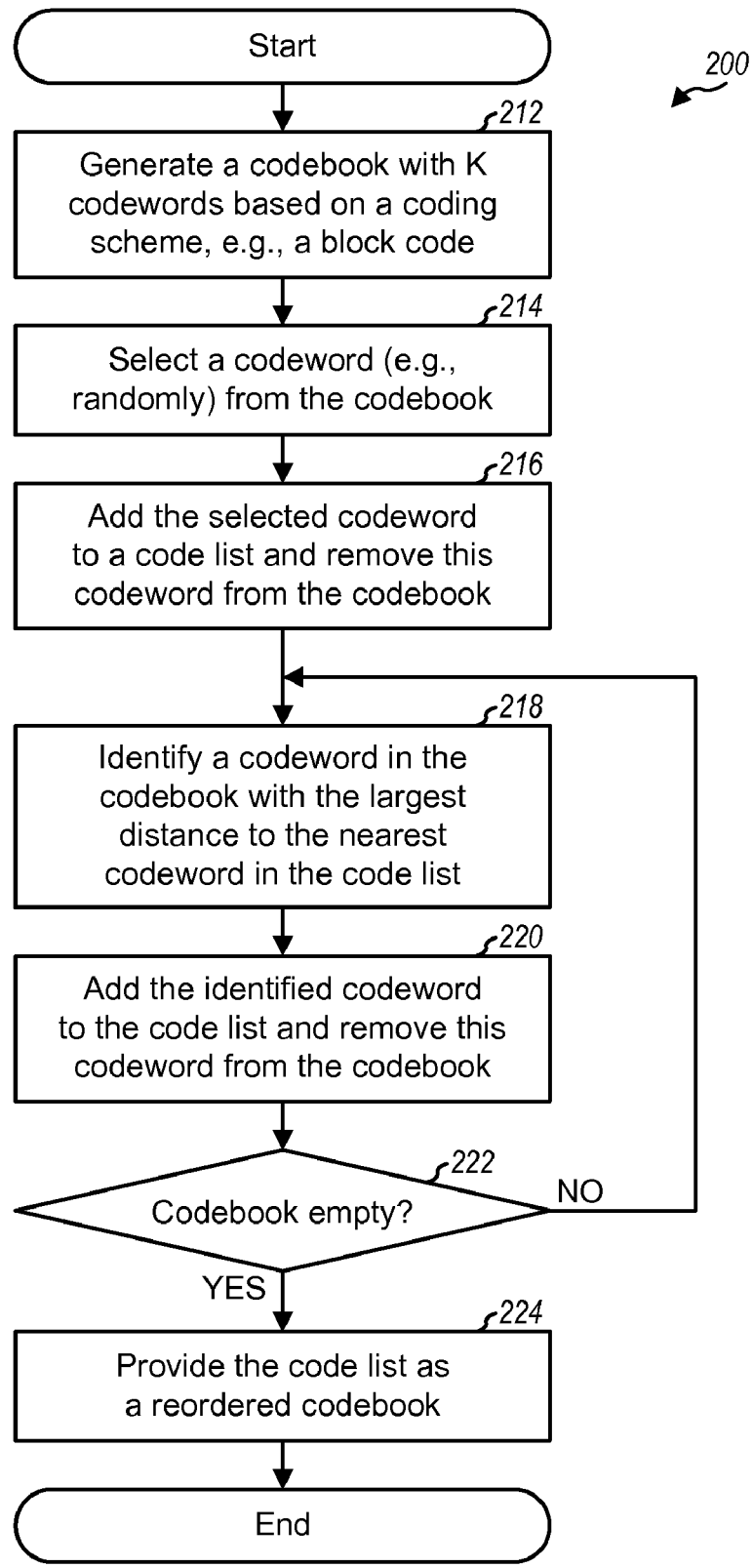
FIG. 2 shows a process for reordering codewords in a codebook.

FIG. 2 shows a process 200 for reordering codewords in a codebook based on relative distance. Initially, a codebook with K codewords may be generated based on a coding scheme, e.g., a block code and/or some other code (block 212). A codeword may be selected (e.g., randomly) from the codebook (block 214). The selected codeword may be added to a code list and removed from the codebook (block 216).

The remaining codewords in the codebook may be added to the code list, one codeword at a time, based on an iterative process.

In each iteration to add one new codeword from the codebook to the code list, a codeword in the codebook with the largest distance to the nearest codeword in the code list is identified (block 218). This may be achieved by (a) determining for each codeword in the codebook the distance between this codeword and the nearest codeword in the code list and (b) selecting the codeword with the largest distance to the nearest codeword. The codeword in the codebook with the largest distance may be added to the code list and removed from the codebook (block 220). A determination is then made whether the codebook is empty (block 222). If the answer is 'No', then the process returns to block 218 for the next iteration to add another codeword to the code list. Otherwise, if the codebook is empty, then all K codewords in the codebook have been added to the code list, and the code list may be provided as a reordered codebook (block 224).

The reordered codebook contains K codewords that have been reordered such that (a) the first two codewords have the largest possible relative distance among the K codewords, (b) the first three codewords have the largest possible relative distance given the prior selection of the first two codewords, (c) the first four codewords have the largest possible relative distance given the prior selection of the first three codewords, etc. Thus, for any given k, where k=1, . . . , K, the first k codewords in the reordered codebook have the largest possible relative distance given that the first k-1 codewords have been selected under the same criterion. The L designated messages may then be remapped to the L messages associated with the first L codewords in the reordered codebook. These L designated messages may then be sent with L codewords having larger relative distance.

FIG. 2 shows an example process to reorder the codewords based on a sequential search that reorders one codeword at a time. The reordered codebook may be used for any number of designated messages, or any value of L, by selecting an appropriate number of topmost or earliest codewords in the reordered codebook.

The reordering may also be performed in other manners. For example, an exhaustive search may be performed to find L codewords in the codebook with the largest possible relative distance. This may be achieved by selecting different combinations of L codewords, determining the relative distance for the L codewords in each combination, and identifying the combination of L codewords with the largest relative distance. The L codewords from the exhaustive search may have larger relative distance than that of the first L codewords in the reordered codebook obtained from the sequential search. This is because the L-th codeword in the sequential search is selected under the constraint of the K-1 prior selected codewords. In contrast, the L codewords in the exhaustive search may be selected without any constraint.

A block code may generate K codewords in a codebook such that codewords with good relative distance are placed early in the codebook and have low indices. An example of such a block code is a Reed-Muller code described below. In this case, the first L codewords $c_0$ through $C_{L-1}$ with indices of 0 through L-1, respectively, may already have good relative distance, and reordering may not be necessary. L designated messages $m_a$ through $m_l$ may be remapped to messages $m_0$ through $m_{L-1}$, respectively, which may be encoded into codewords $c_0$ through $C_{L-1}$, respectively.

In general, L codewords with larger relative distance may be selected from among K codewords in a codebook in various manners, e.g., based on a search for these L codewords or based on the structure of the code. L designated messages may be remapped to the L messages associated with these L codewords.

Figure 3:
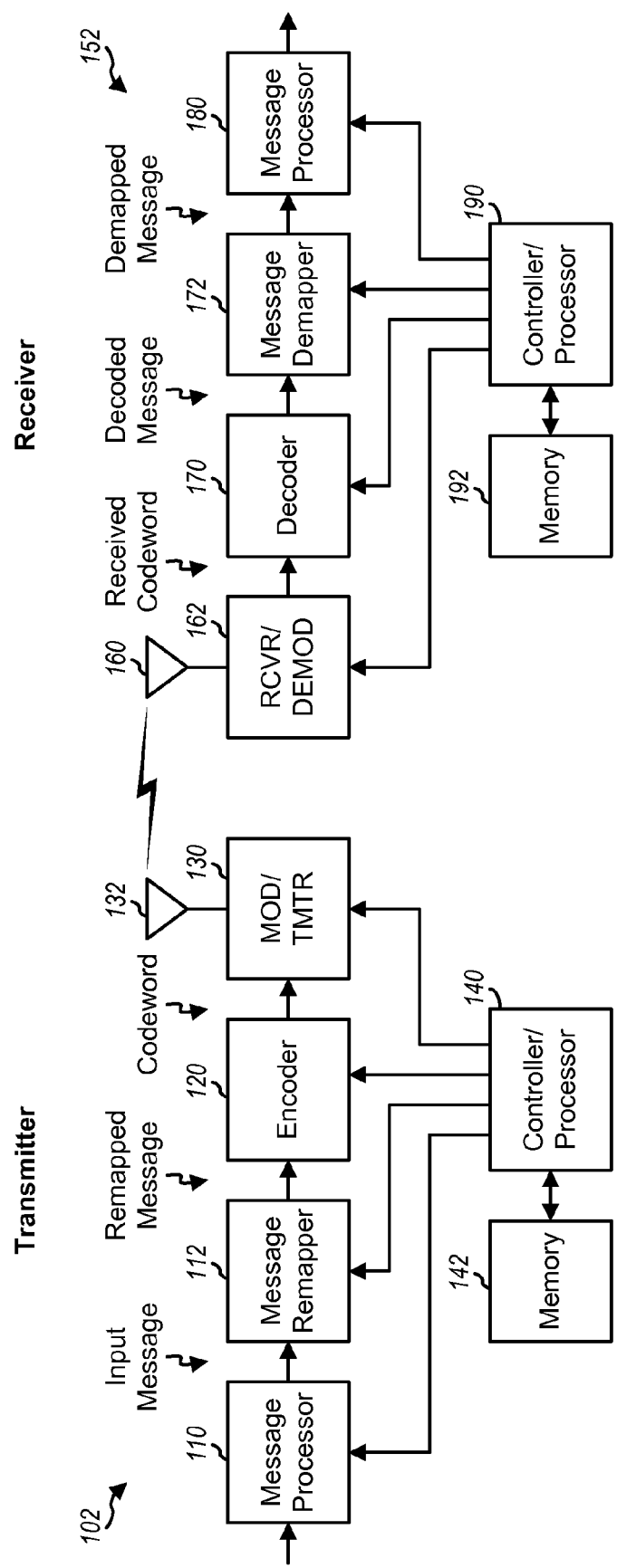
FIG. 3 shows a block diagram of a transmitter and a receiver that perform message remapping and demapping, respectively.

FIG. 3 shows a block diagram of a design of a transmitter 102 and a receiver 152 that perform message remapping and demapping, respectively. At transmitter 102, message processor 110 provides input messages, which may be in the set of L designated messages, to a message remapper 112. Message remapper 112 remaps each input message to a corresponding remapped message based on a remapping scheme that remaps the L designated messages to L remapped messages associated with L codewords having larger relative distance. Encoder 120 encodes each remapped message and provides a corresponding codeword, which is further processed and sent to receiver 152.

At receiver 152, demodulator 162 provides received codewords to decoder 170. Decoder 170 decodes each received codeword and provides a corresponding decoded message to a message demapper 172. Message demapper 172 demaps each decoded message to a corresponding demapped message based on the remapping scheme used by transmitter 102.

The remapping of messages may be selectively performed. For example, a flag may be set to '1' to indicate that remapping is performed and may be clear to '0' to indicate that remapping is not performed. Remapping may be enabled or disabled at the start of a call, when a new application is activated, and/or at other times during the call.

FIG. 4 shows a design of a remapping table 410 that may be used for message remapper 112 at transmitter 102 in FIG. 3. In this design, up to K total messages may be remapped based on a remapping scheme. Message $m_0$ has a value of 0 and is remapped to message $r_0$, message $m_1$ has a value of 1 and is remapped to message $r_1$, message $m_2$ has a value of 2 and is remapped to message $r_2$, and so on, and message $m_{K-1}$ has a value of K-1 and is remapped to message $r_{K-1}$. An input message $m_x$, where $m_x \in \{m_0, \ldots, m_{K-1}\}$, is remapped to message $r_x$, which is encoded and sent to receiver 152. Input message $m_x$ may be in the set of L designated messages. Remapped message $r_x$ may be in the set of L messages associated with codewords having larger relative distance.

FIG. 4 also shows a design of a complementary demapping table 420 that may be used for message demapper 172 at receiver 152 in FIG. 3. In this design, decoded message $r_0$ is demapped to message $m_0$, decoded message $r_1$ is demapped to message $m_1$, decoded message $r_2$ is demapped to message $m_2$, and so on, and decoded message $r_{K-1}$ is demapped to message $m_{K-1}$. A decoded message $r_x$, where $r_x \in \{r_0, \ldots, r_{K-1}\}$, is demapped to message $m_x$, which is provided as a recovered message.

In one design, all K total messages $m_0$ through $m_{K-1}$ are remapped based on a reordered codebook. The messages that are used more often and/or are more important may be remapped to messages associated with codewords having larger relative distances. For example, the message used most often and/or is most important may be remapped to the message associated with the first codeword in the reordered list, the message used second most often and/or is second most important may be remapped to the message associated with the second codeword in the reordered list, etc.

In another design, only the L designated messages are remapped to L messages associated with L codewords having larger relative distance, and the remaining messages are not remapped. For example, the L designated messages $m_a$ through $m_l$ may be remapped to L messages $r_a$ through $r_l$, respectively, which may be associated with L codewords having larger relative distance. Messages $r_a$ through $r_l$ may then be remapped to messages $m_a$ through $m_l$, respectively.

Remapped messages $r_a$ through $r_l$ may be messages $m_0$ through $m_{L-1}$, respectively, if codewords of low indices have good relative distance. Messages $m_i$, for $m_i \notin \{m_a, \ldots, m_l, r_a, \ldots, r_l\}$, are not remapped. If L is much smaller than K, then the remapping may be achieved with a small look-up table for only 2L affected messages. The complexity of the remapping may then be of order L, where L is the number of messages to be remapped.

For clarity, the message remapping techniques are described below for Reed-Muller codes, which are a class of linear block codes covering a wide range of rates and minimum distances. Reed-Muller codes have certain desirable properties and may be soft-decoded with a simple trellis decoder or correlators. Reed-Muller codes are used in communication systems such as UMTS and LTE to encode information such as transport format combination indicator (TFCI), channel quality indicator (CQI), etc.

A generator matrix G for a q-th order Reed-Muller code of length N may be obtained as follows. Let $v_0$ be a row vector with N ones ('1'), where N is the codeword size or number of bits in a codeword. Let $v_1, v_2, \ldots, v_P$ be P row vectors corresponding to P rows of a P×N matrix V containing all possible combinations of P bits in N columns, where $N=2^P$. Generator matrix G contains row vectors $v_0, v_1, \ldots, v_P$, and also all products of $v_1, v_2, \ldots, v_P$ two at a time for a second-order Reed-Muller code, and so on, and also all products of $v_1, v_2, \ldots, v_P$ q at a time for a q-th order Reed-Muller code. Generator matrix G contains B rows, where B is the message length in number of bits.

A message may be encoded based on generator matrix G, as follows:

$$x = u\,G, \quad \text{Eq(1)}$$

where u is a 1×B row vector containing B bits of the message, and x is a 1×N row vector containing N bits of a codeword for the message.

The matrix multiplication in equation (1) is with modulo-2 multiplication.

As an example, a generator matrix $G_{8,7}^2$ for a second-order Reed-Muller code of length 8 may be given as:

$$G_{8,7}^2 = \begin{bmatrix} v_0 \\ v_1 \\ v_2 \\ v_3 \\ v_{1,2} \\ v_{1,3} \\ v_{2,3} \end{bmatrix} = \begin{bmatrix} 1 & 1 & 1 & 1 & 1 & 1 & 1 & 1 \\ 1 & 0 & 1 & 0 & 1 & 0 & 1 & 0 \\ 1 & 1 & 0 & 0 & 1 & 1 & 0 & 0 \\ 1 & 1 & 1 & 1 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 1 & 0 & 0 & 0 & 0 & 0 & 0 \end{bmatrix}, \quad \text{Eq (2)}$$

where $v_{a,b} = v_a \otimes v_b$ and "$\otimes$" denotes an element-by-element product. A message of 7 bits may be encoded with generator matrix $G_{8,7}^2$ to obtain a codeword of 8 bits.

As another example, a generator matrix $G_{32,16}^2$ for a second-order Reed-Muller code of length 32 may contain 16 row vectors $v_0, v_1, v_2, v_3, v_4, v_5, v_{1,2}, v_{1,3}, v_{1,4}, v_{1,5}, v_{2,3}, v_{2,4}, v_{2,5}, v_{3,4}, v_{3,5}$ and $v_{4,5}$. Each row vector is of length 32. A message of 16 bits may be encoded with generator matrix $G_{32,16}^2$ to obtain a codeword of 32 bits. If the message contains fewer than 16 bits, then a sub-code of the second-order Reed-Muller code may be used to encode the message. For example, if the message contains 10 bits, then a generator matrix may be formed with 10 rows (e.g., the first 10 rows) of generator matrix $G_{32,16}^2$ and used to encode the message to obtain a codeword of 32 bits.

In UMTS, a generator matrix $G_{32,10}^2$ for a sub-code of a second-order Reed-Muller code of length 32 is defined as follows:

$$G_{32,10}^2 = \begin{bmatrix} 00101010101010101101010101010101 \\ 00110011001100110110011001100110 \\ 00111100001111000111100001111000 \\ 00111111110000000111111110000000 \\ 10111111111111111000000000000000 \\ 11111111111111111111111111111111 \\ 10111011100000111110001100001010 \\ 00111000111011101101100111000000 \\ 00110101001101100100111110101000 \\ 00100010101110101110110000111000 \end{bmatrix} \quad \text{Eq (3)}$$

Generator matrix $G_{32,10}^2$ contains 10 rows, with each row corresponding to a different basis sequence. A 10-bit message may be represented as $u=[u_0\ u_1 \ldots u_9]$, where $u_0$ is the least significant bit (LSB) and $u_9$ is the most significant bit (MSB). The 10-bit message may be encoded with generator matrix $G_{32,10}^2$ as shown in equation (1) to obtain a 32-bit codeword, which may be represented as $x=[x_0\ x_1 \ldots x_{31}]$.

K=1024 different messages may be encoded with generator matrix $G_{32,10}^2$ to obtain 1024 different codewords. Each codeword is a different linear combination of the ten basis sequences in $G_{32,10}^2$. A codebook containing the 1024 codewords generated with $G_{32,10}^2$ may be reordered (e.g., as shown in FIG. 2) to obtain a reordered codebook. L designated messages may then be remapped to L messages associated with the first L codewords in the reordered codebook. L may be a value that may be dependent on application and may thus vary from application to application. The reordered codebook allows for easy identification of better codewords and may be used to remap any number of messages.

The Reed-Muller code generates codeword $c_0$ for message $m_0$, codeword $c_1$ for message $m_1$, codeword $c_2$ for message $m_2$, and so on, and codeword $c_{K-1}$ for message $m_{K-1}$. The natural order of the K codewords is $c_0, c_1, c_2, \ldots, c_{K-1}$. It can be shown that the naturally ordered codewords have good relative distance. This is due to the placement of better basis sequences with larger distances in the top rows of generator matrix $G_{32,10}^2$. These top rows are associated with LSBs of the messages being encoded. Consequently, codewords with larger relative distance are generated for messages with low values, e.g., the first 70 messages with values of 0 through 69 among 1024 total messages.

Table 1 gives the relative distance x and the number of neighbor codewords y at relative distance x for (a) the first L codewords in a reordered codebook obtained from matrix generator $G_{32,10}^2$ and (b) the first L codewords generated in the natural order with $G_{32,10}^2$. For each value of L, for L= 2, . . . , 10, the second and fifth columns give (x, y) for the reordered codebook, and the third and sixth columns give (x, y) for the natural order. The number of neighbor codewords and the relative distance both affect probability of error (PE) for messages. In general, larger relative distance x and fewer neighbor codewords y are desired. It can be shown that PE performance is comparable for the reordered codebook and the natural order.

TABLE 1

| L | Reordered Codebook | Natural Order |
|---|---|---|
| 2 | (1, 30) | (1, 16) |
| 3 | (2, 15) | (2, 16) |
| 4 | (2, 15) | (3, 16) |
| 5 | (1, 14) | (4, 16) |
| 6 | (1, 14) | (5, 16) |
| 7 | (1, 14) | (6, 16) |
| 8 | (1, 14) | (7, 16) |
| 9 | (2, 14) | (8, 16) |
| 10 | (2, 14) | (9, 16) |

In UMTS, a transmitter may send data on one or more transport channels to a receiver. Each transport channel may carry data for one or more services such as voice, video, packet data, etc. The data on each transport channel may be processed based on a set of one or more transport formats (TFs) selected for that transport channel, which is referred to as a transport format set. Each transport format defines various processing parameters such as a transmission time interval (TTI) over which the transport format applies, the number of transport blocks within the TTI, the size of each transport block, the coding scheme used in the TTI, etc. The transport format may change from TTI to TTI for each transport channel.

Various transport format combinations (TFCs) may be defined for various combinations of transport formats that may be used for the transport channels. A specific TFC may be selected in each TTI from among all of the available TFCs. The selected TFC indicates a specific transport format to use for each active transport channel and is identified by an index that is referred to as a TFC indicator (TFCI).

Table 2 shows an example in which three transport channels TrCH1, TrCH2 and TrCH3 are used for communication, three transport formats are available for each of TrCH1 and TrCH2, two transport formats are available for TrCH3, and four TFCs are available for use. In the example shown in Table 2, if the receiver receives TFCI of 3, then the receiver will know that TrCH1 uses TF2, TrCH2 uses TF1, and TrCH3 uses TF0.

TABLE 2

| TFCI | TrCH1 | TrCH2 | TrCH3 |
|---|---|---|---|
| 1 | TF0 | TF0 | TF0 |
| 2 | TF1 | TF0 | TF0 |
| 3 | TF2 | TF1 | TF0 |
| 4 | TF0 | TF2 | TF1 |

A set of TFCs may be defined at the start of a call (e.g., during call setup) and made available for use during the call. Alternatively, all TFCs may be predefined and known a priori by both the transmitter and receiver. The use of predefined TFCs may shorten call setup since these TFCs are already known and do not need to be negotiated. In any case, the number of TFCs available for use in a given call may be a small subset of all possible TFCs and may be dependent on the application. As an example, 72 TFCs may be used for Voice-over-Internet Protocol (VoIP) to cover three packet sizes, seven payload sizes, and three header sizes. If 10 bits are used for the TFCI, then only 72 TFCIs may be used out of 1024 total TFCIs. Furthermore, the 72 TFCs may not be used uniformly. For example, only four out of the 72 TFCs may be used much of the time for four preferred rates (e.g., 12.2, 7.4, 5.9, and 4.75 kbps), and the remaining 68 TFCs may be used infrequently.

In general, the available TFCs may be a small subset of the total TFCs (e.g., 72 out of 1024), and the frequently used TFCs may be a small subset of the available TFCs (e.g., 4 out of 72). A specific TFC may be selected from among the available TFCs in each TTI. The TFCI for the selected TFC may be encoded (e.g., with a Reed-Muller code) to generate a codeword for the TFCI. The TFCIs for the TFCs may be remapped to improve performance. In one design, only the TFCIs for the frequently used TFCs are remapped to other TFCIs associated with codewords having larger relative distance. In another design, the TFCIs for the available TFCs are remapped to other TFCIs associated with codewords having larger relative distance. In both designs, the TFCIs may be remapped based on how frequent the TFCs are used. For example, the TFCI for the most frequently used TFC may be remapped to the TFCI associated with the first codeword in the reordered codebook or the first naturally ordered codeword, the TFCI for the second most frequently used TFC may be remapped to the TFCI associated with the second codeword in the reordered codebook or the second naturally ordered codeword, etc.

A TFCI may be encoded alone to generate a codeword. A TFCI may also be combined with other information and then encoded to generate a codeword. In 3GPP Release 1999 (R99), a TFCI is represented with 10 bits, there are 1024 total TFCIs, and a TFCI is encoded alone with a second-order Reed-Muller code to generate a codeword. In 3GPP Release 6, a TFCI is represented with 7 bits, there are 128 total TFCIs, and a TFCI is combined with other information and then encoded with the second-order Reed-Muller code to generate a codeword.

FIG. 5A shows a format 500 of an Enhanced Dedicated Channel (E-DCH) Dedicated Physical Control Channel (E-DPCCH) sent by a UE on the uplink in 3GPP Release 6. The E-DPCCH carries signaling for an E-DCH Dedicated Physical Data Channel (E-DPDCH). A signaling message sent on the E-DPCCH includes a 7-bit TFCI, a happy bit, and a 2-bit redundancy version. The redundancy version indicates a retransmission count for a packet sent on the E-DPDCH and is derived from a retransmission sequence number (RSN) provided by higher layer. The happy bit indicates whether or not the UE is happy with the current resource grant. In 3GPP Release 6, the TFCI occupies the seven MSBs of the signaling message, the happy bit occupies the next lesser significant bit, and the redundancy version occupies the two LSBs. The 10-bit signaling message is encoded with a second-order Reed-Muller code to generate 30 code bits, which are sent on the E-DPCCH.

In 3GPP Release 6, the happy bit and redundancy version may change in each transmission. The happy bit may be set to '0' to indicate that the UE is not happy with the current resource grant or to '1' to indicate that the UE is happy. There are two possible codewords for each TFCI for two possible values of the happy bit. For some applications such as VoIP, which typically generates small packets, the happy bit may be set to '1' most of the time to indicate that the current resource grant is sufficient. The redundancy version may be set to '0', '1', '2' or '3'. There are four possible codewords for each TFCI for four possible values of the redundancy version. For some applications such as VoIP, only a small number of retransmissions (if any) may be sent. Hence, the redundancy version may be assumed to be to either '0' or '1' most of the time.

In 3GPP Release 6, 128 TFCIs are predefined and known a priori by the Node Bs and UEs. Different applications may use different TFCIs more frequently. The transmitter and receiver may not know which TFCIs will be used more frequently for a given application (e.g., VoIP) and may identify these TFCIs when the application is active. The frequently used TFCIs for this application may be stored so that these TFCIs may be quickly determined when the same application is activated at a future time.

For a given application, the frequently used TFCIs may be determined, e.g., when the application is active or based on information collected previously for the application. Frequently used messages may then be determined based on the frequently used TFCIs, an assumed value of '1' for the happy bit, and assumed values of '0' and '1' for the redundancy version. For example, if four TFCIs are used frequently for VoIP, then eight (or 4×1×2) frequently used messages may be determined for these four TFCIs, a value of '1' for the happy bit, and one bit for the redundancy version. These eight frequently used messages may be remapped to the first eight codewords in the reordered codebook, the first eight naturally ordered codewords, etc.

The format of the signaling message may also be defined such that more commonly used messages and/or more important messages are mapped to codewords with larger relative distance. For example, the TFCI, happy bit, and redundancy version may be rearranged to take advantage of the fact that codewords of low indices may have better relative distance.

FIG. 5B shows a format 550 of a signaling message that may achieve improved performance. In format 550, the happy bit occupies the MSB of the signaling message, the redundancy version occupies the next two less significant bits, and the TFCI occupies the seven LSBs. The happy bit may be defined such that '0' (instead of '1') indicates that the UE is happy with the current resource grant. With this format and the assumptions described above, the two MSBs will be '00' most of the time, and only the 8 LSBs may change. The message may be encoded with the second-order Reed-Muller code and may be mapped to one of the first 128 naturally ordered codewords most of the time, which may have better relative distance than the remaining 896 codewords. By arranging the fields of the message to take advantage of the code characteristics, remapping of the message may be avoided.

The message remapping techniques described herein may be used to remap messages carrying various types of information. For example, the techniques may be used for messages carrying the following:

Only TFCI information,
Combination of TFCI, happy bit, and redundancy version information,
Only CQI information,
Combination of CQI and acknowledgement and/or negative acknowledgement (ACK/NAK) information, or
Some other information or combination of information.

Different CQI values may be defined for different signal-to-noise ratios (SNRs), different rates, etc. CQI values for higher SNRs or higher rates may be deemed more important since correct reception of these CQI values may have greater impact of data performance than CQI values for lower SNRs or lower rates. The CQI values for higher SNRs or higher rates may be remapped to messages associated with codewords having larger relative distance. Alternatively or additionally, more frequently used CQI values may be remapped to messages associated with codewords having larger relative distance. The remapping may be based on the particular code used to generate codewords for CQI information, e.g., a Reed-Muller code (20,5) that generates 20-bit codewords for 5-bit CQI values.

Figure 6:
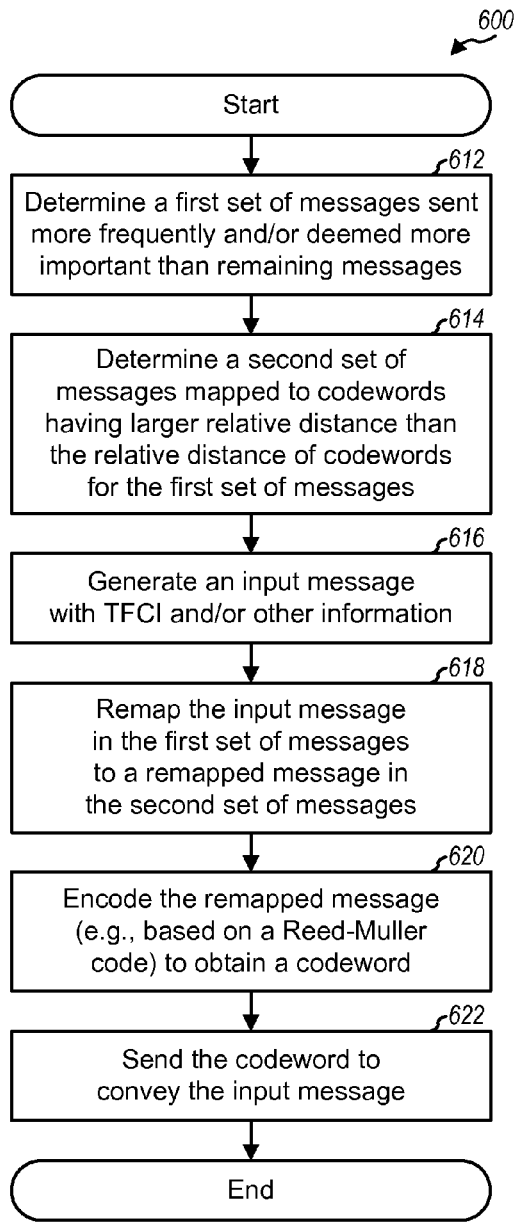
FIG. 6 shows a process performed by a transmitter to send information.

FIG. 6 shows a process 600 performed by a transmitter, e.g., a Node B or a UE, to send information. A first set of messages that is sent more frequently and/or deemed more important than remaining messages may be determined (block 612). The frequently used messages may be identified during a call or determined in other manners. A second set of messages that is associated with codewords having larger relative distance than the relative distance of the codewords for the first set of messages may be determined (block 614). The second set may include messages that are associated with (a) codewords of low (or lowest) indices among all codewords generated by a code or (b) codewords with large (or largest) relative distance among codewords in a reordered codebook. An input message is generated based on TFCI and/or other information (block 616). The input message may be in the first set of messages and may be remapped to a remapped message in the second set of messages (block 618). The remapped message may be encoded (e.g., based on a Reed-Muller code or some other code) to obtain a codeword (block 620). The codeword may be sent to convey the input message (block 622).

The input message may be remapped and then encoded if remapping is enabled. The input message may also be encoded directly if remapping is not enabled. The input message may carry TFCI and possibly other information such as a happy bit and a redundancy version. The input message may also carry CQI and possibly other information such as ACK/NAK. The input message may also carry other information.

Figure 7:
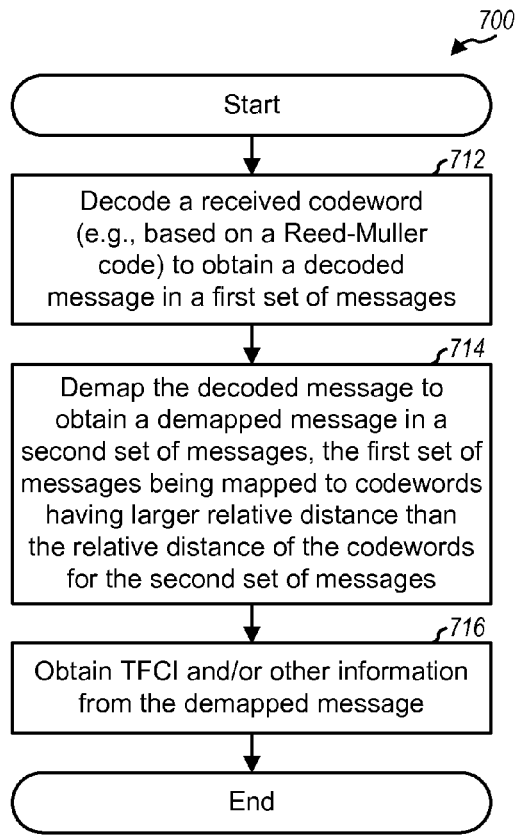
FIG. 7 shows a process performed by a receiver to receive information.

FIG. 7 shows a process 700 performed by a receiver, e.g., a UE or a Node B, to receive information. A received codeword may be decoded (e.g., based on a Reed-Muller code or some other code) to obtain a decoded message in a first set of messages (block 712). The decoded message may be demapped to a demapped message in a second set of messages, with the first set of message being associated with codewords having larger relative distance than the relative distance of the codewords for the second set of messages (block 714). TFCI and/or other information may be obtained from the demapped message (block 716).

The message remapping techniques described herein may provide improved performance (e.g., lower error probability) for remapped messages sent with a given amount of transmit power. The techniques may also be used to reduce transmit power for a given level of performance (e.g., a given error probability).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus comprising:
   a processor to remap an input message to a remapped message, to encode the remapped message to obtain a codeword, and to send the codeword to convey the input message, wherein the input message is in a first set of messages and the remapped message is in a second set of messages, the second set of messages being mapped to codewords having larger relative distance than relative distance of codewords for the first set of messages; and
   a memory coupled to the processor.

2. The apparatus of claim 1, wherein the first set comprises messages sent more frequently than remaining messages.

3. The apparatus of claim 1, wherein the first set comprises messages deemed more important than remaining messages.

4. The apparatus of claim 1, wherein the input message carries signaling for a Voice-over-Internet Protocol (VoIP) call, and wherein the first set includes L messages that are used frequently among K total messages, where L and K are integer values and L is less than K.

5. The apparatus of claim 1, wherein the second set comprises messages mapped to codewords of low indices among codewords in a codebook.

6. The apparatus of claim 1, wherein the second set comprises messages mapped to codewords with large relative distance among codewords in a reordered codebook.

7. An apparatus comprising:
   a processor to remap an input message to a remapped message, to encode the remapped message to obtain a codeword, and to send the codeword to convey the input message; and
   a memory coupled to the processor, wherein the processor identifies messages used frequently during a call and forms a first set with the frequently used messages.

8. An apparatus comprising:
   a processor to remap an input message to a remapped message, to encode the remapped message to obtain a codeword based on a Reed-Muller code, and to send the codeword to convey the input message; and
   a memory coupled to the processor.

9. An apparatus comprising:
   a processor to remap an input message to a remapped message, to encode the remapped message to obtain a codeword, and to send the codeword to convey the input message, wherein the processor remaps the input message to the remapped message and encodes the remapped message to obtain the codeword if remapping is enabled, and encodes the input message to obtain the codeword if remapping is not enabled; and
   a memory coupled to the processor.

10. An apparatus comprising:
    a processor to remap an input message to a remapped message, to encode the remapped message to obtain a codeword, and to send the codeword to convey the input message, wherein the input message includes a transport format combination indicator (TFCI); and
    a memory coupled to the processor.

11. The apparatus of claim 10, wherein the input message further includes a happy bit and a redundancy version.

12. An apparatus comprising:
    a processor to remap an input message to a remapped message, to encode the remapped message to obtain a codeword, and to send the codeword to convey the input message, wherein the input message includes a channel quality indicator (CQI); and
    a memory coupled to the processor.

13. The apparatus of claim 12, wherein the input message further includes an acknowledgement (ACK) or a negative acknowledgement (NAK).

14. A method comprising:
    remapping an input message to a remapped message
    encoding the remapped message to obtain a codeword; and
    sending the codeword to convey the input message, wherein the input message is in a first set of messages and the remapped message is in a second set of messages, the second set of messages being mapped to codewords having larger relative distance than relative distance of codewords for the first set of messages.

15. A method comprising:
    remapping an input message to a remapped message;
    encoding the remapped message to obtain a codeword;
    sending the codeword to convey the input message;
    identifying messages used frequently during a call; and
    forming a first set with the frequently used messages.

16. A method comprising:
    remapping an input message to a remapped message;
    encoding the remapped message to obtain a codeword based on a Reed-Muller code; and
    sending the codeword to convey the input message.

17. An apparatus comprising:
    means for remapping an input message to a remapped message;
    means for encoding the remapped message to obtain a codeword; and means for sending the codeword to convey the input message, wherein the input message is in a first set of messages and the remapped message is in a second set of messages, the second set of messages being mapped to codewords having larger relative distance than relative distance of codewords for the first set of messages.

18. An apparatus comprising:
means for remapping an input message to a remapped message;
means for encoding the remapped message to obtain a codeword based on a Reed-Muller code; and
means for sending the codeword to convey the input message.

19. A processor readable media for storing instructions operable to:
remap an input message to a remapped message;
encode the remapped message to obtain a codeword; and
send the codeword to convey the input message, wherein the input message is in a first set of messages and the remapped message is in a second set of messages, the second set of messages being mapped to codewords having larger relative distance than relative distance of codewords for the first set of messages.

20. A processor readable media for storing instructions operable to:
remap an input message to a remapped message;
encode the remapped message to obtain a codeword based on a Reed-Muller code; and
send the codeword to convey the input message.

21. An apparatus comprising:
a processor to decode a received codeword to obtain a decoded message in a first set of messages, and to demap the decoded message to obtain a demapped message in a second set of messages, the first set of messages being associated with codewords having larger relative distance than relative distance of codewords for the second set of messages; and
a memory coupled to the processor.

22. The apparatus of claim 21, wherein the processor decodes the received codeword based on a Reed-Muller code to obtain the decoded message.

23. The apparatus of claim 21, wherein the processor obtains a transport format combination indicator (TFCI) from the demapped message.

24. The apparatus of claim 21, wherein the processor identifies messages used frequently during a call and forms a first set with the frequently used messages.

25. A method comprising:
decoding a received codeword to obtain a decoded message in a first set of messages; and
demapping the decoded message to obtain a demapped message in a second set of messages, the first set of messages being associated with codewords having larger relative distance than relative distance of codewords for the second set of messages.

26. The method of claim 25, wherein the decoding the received codeword comprises
decoding the received codeword based on a Reed-Muller code to obtain the decoded message.

27. The method of claim 25, further comprising:
obtaining a transport format combination indicator (TFCI) from the demapped message.

28. An apparatus comprising:
means for decoding a received codeword to obtain a decoded message in a first set of messages; and
means for demapping the decoded message to obtain a demapped message in a second set of messages, the first set of messages being associated with codewords having larger relative distance than relative distance of codewords for the second set of messages.

29. The apparatus of claim 28, wherein the means for decoding the received codeword comprises
means for decoding the received codeword based on a Reed-Muller code to obtain the decoded message.

30. An apparatus comprising:
a processor to form an input message with a plurality of fields arranged such that at least one most significant bit of the message is presumed to be equal to zero, and to encode the input message based on a code to obtain a codeword, the code generating a plurality of codewords for a plurality of input messages, with codewords of low indices having larger relative distance than relative distance of codewords of high indices; and
a memory coupled to the processor.

31. The apparatus of claim 30, wherein the processor encodes the input message based on a Reed-Muller code to obtain the codeword.

32. The apparatus of claim 30, wherein the input message comprises three fields for a transport format combination indicator (TFCI), a happy bit, and a redundancy version.

* * * * *